US006307300B1

(12) United States Patent
Yamamoto et al.

(10) Patent No.: US 6,307,300 B1

(45) Date of Patent: Oct. 23, 2001

(54) PIEZOELECTRIC ACOUSTIC COMPONENT

(75) Inventors: Takashi Yamamoto, Ishikawa-ken; Tetsuo Takeshima, Toyama; Takeshi Kishimoto, Toyama-ken, all of (JP)

(73) Assignee: Murata Manufacturing Co., LTD, Kyoto (JP)

(*) Notice: Subject to any disclaimer, the term of this patent is extended or adjusted under 35 U.S.C. 154(b) by 0 days.

(21) Appl. No.: 09/311,821

(22) Filed: May 13, 1999

(30) Foreign Application Priority Data

Jun. 11, 1998 (JP) ........................................ 10-163841

(51) Int. Cl.[7] ........................................ H01L 41/08

(52) U.S. Cl. ........................ 310/322; 310/324; 310/348; 310/345

(58) Field of Search ........................ 310/324, 334, 310/345, 348, 351, 353, 321, 322, 346

(56) References Cited

U.S. PATENT DOCUMENTS 3,331,970 * 7/1967 Dundon et al. .................... 310/324
3,890,513 * 6/1975 Barleen et al. .................... 310/324
4,282,520 * 8/1981 Shipp et al. .................... 310/324 X
4,486,742 * 12/1984 Kudo et al. .................... 310/324 X
5,030,875 * 7/1991 Knecht .................... 310/346

FOREIGN PATENT DOCUMENTS 3-125396 12/1991 (JP) .
7-107593 4/1995 (JP) .
7-203590 4/1995 (JP) .
277201 6/1996 (TW) .

* cited by examiner

*Primary Examiner*—Mark O. Budd

(74) *Attorney, Agent, or Firm*—Keating & Bennett, LLP

(57) ABSTRACT

A piezoelectric acoustic component includes a unimorph-type vibration body, a mounting substrate, and a cover. The vibration body includes a substantially rectangular piezoelectric plate and a substantially rectangular metallic plate bonded to the back side of the piezoelectric plate. Longitudinal opposite end portions of the vibration body are fixed onto the mounting substrate via respective support members. The metallic plate of the vibration body is fixedly connected to a first electrode located on the mounting substrate via one of the support members, whereas the electrode located on the front side of the piezoelectric plate is connected to a second electrode located on the mounting substrate via a conductive wire. A gap between the mounting substrate and each of lateral opposite end portions of the vibration body is charged with silicone rubber, thereby defining an acoustic space between the vibration body and the mounting substrate. A cover having a sound release hole formed therein is bonded onto the mounting substrate so as to cover the vibration body without contacting the same.

19 Claims, 6 Drawing Sheets

Distribution of Displacements

Distribution of Displacements

PIEZOELECTRIC ACOUSTIC COMPONENT

BACKGROUND OF THE INVENTION

1. Field of the Invention

The present invention relates to a piezoelectric acoustic component, such as a piezoelectric buzzer or a piezoelectric receiver.

2. Description of the Related Art

Piezoelectric acoustic components, such as piezoelectric buzzers for producing an alarm or operation beep, or piezoelectric receivers, are widely used in, for example, electronic apparatuses, household electrical appliances, and cellular phones.

As described in Japanese Patent Application Laid-Open (kokai) Nos. 7-107593 and 7-203590, such a piezoelectric acoustic component typically has a structure in which a circular metallic plate is bonded to an electrode provided on one major surface of a piezoelectric plate to thereby constitute a unimorph-type vibration body. In such a structure, the vibration body is disposed within a circular housing such that the circumferential edge portion of the metallic plate is supported by the housing and the opening portion of the housing is covered by a cover.

However, use of such a circular vibration body results in poor production efficiency, low acoustic conversion efficiency, and difficulty in implementing a surface-mounting structure. These problems will be described in detail below.

First, production efficiency and acoustic conversion efficiency will be discussed. A process of manufacturing such a piezoelectric acoustic component includes the steps of: forming a circular piezoelectric plate 42 from a green sheet 40 by use of a blanking punch 41 as shown in FIG. 1A; electrically and mechanically bonding a circular metallic plate 43 to an electrode disposed on one major surface of the piezoelectric plate 42 as shown in FIG. 1B; applying a high-voltage direct-current electric field between electrodes located on the opposite main surfaces of the piezoelectric plate 42 for effecting polarization to thereby obtain a vibration body 44; disposing the vibration body 44 within a housing 45; and extending out to the exterior of the housing 45 lead wires 46 and 47 connected respectively to the electrode located on the other major surface of the piezoelectric plate 42 and the metallic plate 43, as shown in FIG. 1C.

However, forming the disc-like piezoelectric plates 42 from the green sheet 40 using a punch as shown in FIG. 1A results in a large portion of the green sheet 40 being unused, resulting in poor material utilization. Since formation of the electrodes and polarization are performed on an individual basis after blanking, processing efficiency is poor. Further, since the blanking punch 41 must be manufactured according to the size of the piezoelectric plate 42, the overall production efficiency is even worse.

As shown in FIG. 2A, since the disc-like vibration body 44 is fixed at a circumferential portion by the housing 45, a maximum displacement point P appears only at the center thereof, so that the volume of displacement is small and the acoustic conversion efficiency is low. As a result, the sound pressure is very low in relation to input energy. Further, since the vibration body 44 is circumferentially restricted, a high frequency is generated. In order to obtain a piezoelectric vibration body of a low frequency, the radius of the vibration body must be increased.

Next, implementation of a surface-mounting structure will be discussed. A piezoelectric acoustic component of a surface-mounting structure is disclosed in, for example, Japanese Utility Model Application Laid-Open (kokai) No. 3-125396. However, this structure has many drawbacks. More specifically, since lead terminals must be integrally formed on the metallic plate, the shape of the metallic plate becomes complicated. Also, the shape of the housing becomes complicated because of the need to extend the lead terminals out from the housing. Further, since the lead terminals are brought into contact with or are fixedly attached to the piezoelectric plate, a load is apt to be exerted on the piezoelectric plate. Therefore, implementation of such a piezoelectric acoustic component of a surface-mounting structure is inferior because of the poor reliability and the high cost of manufacture.

SUMMARY OF THE INVENTION

To overcome the above described problems, preferred embodiments of the present invention provide a piezoelectric acoustic component including a vibration body having a substantially rectangular piezoelectric plate with a first major surface and a second major surface, a first vibration body electrode provided on the first major surface of the piezoelectric plate and a substantially rectangular metallic plate provided on the second major surface of the piezoelectric plate, a mounting substrate including a first circuit electrode and a second circuit electrode disposed thereon, the first circuit electrode being connected to the metallic plate, the second circuit electrode being connected to the first vibration body electrode, support members being arranged such that the vibration body is mounted on the mounting substrate at longitudinal opposite end portions thereof via the support members such that a gap is defined between the mounting substrate and the longitudinal opposite end portions of the vibration body, an elastic sealing material sealing the gap between the mounting substrate and each of lateral opposite end portions of the vibration body to thereby define an acoustic space between the vibration body and the mounting substrate, and a cover having a sound release hole provided therein and which is bonded onto the mounting substrate so as to cover the vibration body without the cover contacting the vibration body.

Since the piezoelectric plate has a substantially rectangular shape, even if piezoelectric plates are blanked from a green sheet, the portion of the green sheet that remains unused is greatly reduced as compared to the prior art, so that the material utilization rate is greatly improved and very high in preferred embodiments of the present invention. Further, since formation of electrodes and polarization can be performed on a parent substrate, from which a plurality of piezoelectric plates are cut, production efficiency is greatly improved. In addition, since various kinds of piezoelectric plates having different design dimensions can be obtained by changing the cutting dimensions or positions of the parent substrate, it is unnecessary to make a blanking punch of a different size for each kind of piezoelectric plates, in contrast to the case of the conventional piezoelectric acoustic component. More specifically, the number of kinds of, for example, dies, jigs, and piezoelectric bodies used in production steps ranging from blanking of the green sheet to cutting of the parent substrate is greatly reduced, thereby significantly reducing the cost of production and improving production efficiency.

In the piezoelectric acoustic component according to preferred embodiments of the present invention, the longitudinal opposite end portions of the substantially rectangular vibration body are fixed onto the mounting substrate via the respective support members. Therefore, when a signal of a predetermined frequency is input between the metallic plate and the electrode provided on the other major surface of the piezoelectric plate, the piezoelectric plate expands and contracts, and thus, the substantially rectangular vibration body bends accordingly. At this time, the vibration body vibrates in a direction that is substantially perpendicular to a major surface thereof with the longitudinal opposite end portions functioning as nodes of vibration, and maximum-displacement points P are produced along the center line in the longitudinal direction. That is, displacement volume greatly increases. Since the displacement volume is in direct proportion to the amount of energy for moving the air, acoustic conversion efficiency is thereby greatly increased.

Although the gap between the mounting substrate and each of lateral opposite end portions of the vibration body is sealed by the sealing material, the sealing material does not hinder vibration of the vibration body, because of the elasticity of such material. Since a portion of the vibration body located between the fixed longitudinal opposite end portions can be freely displaced, the vibration body can produce a frequency lower than that produced by a disc-like vibration body used in the prior art. In other words, when a desired frequency is to be generated, the substantially rectangular vibration body used in preferred embodiments of the present invention can be made smaller than can the disc-like vibration body used in the prior art.

Since the cover is bonded onto the mounting substrate so as to cover the vibration body in a non-contacting manner, a substantially sealed condition is established around the vibration body, and surface mounting can be easily implemented. More specifically, the first and second electrodes provided on the mounting substrate may be lead out to the end surfaces or the opposite sides of the mounting substrate so as to be used as external terminals. This structure simplifies the shapes of the metallic plate, the housing, and other members.

In the above described piezoelectric acoustic component, the support members may be made of a conductive material, and the metallic plate of the vibration body may be fixedly connected to the first circuit electrode disposed on the mounting substrate via the support member, whereas the first vibration body electrode disposed on the first major surface of the piezoelectric plate may be connected to the second circuit electrode disposed on the mounting substrate via a conductive wire.

Since the vibration body and the mounting substrate can be electrically and mechanically connected via the support members, the structure of the piezoelectric acoustic component becomes simple, and reliable electrical connections are established. Further, since a lead terminal is not connected to the vibration body, an external load is not exerted on the vibration body, thereby yielding a highly reliable piezoelectric acoustic component.

Other features and advantages of the present invention will become apparent from the following description of preferred embodiments of the invention which refers to the accompanying drawings.

DETAILED DESCRIPTION OF PREFERRED EMBODIMENTS

Figure 1A:
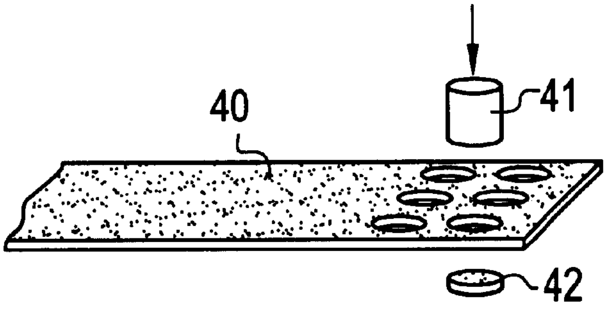
FIG. 1A PRIOR ART
FIGS.1A–1C are views showing the steps of a process for making a circular piezoelectric buzzer according to a conventional method.
Figure 1B:
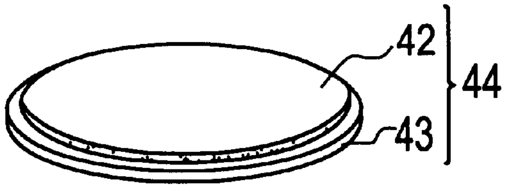
FIG. 1B PRIOR ART
Figure 1C:
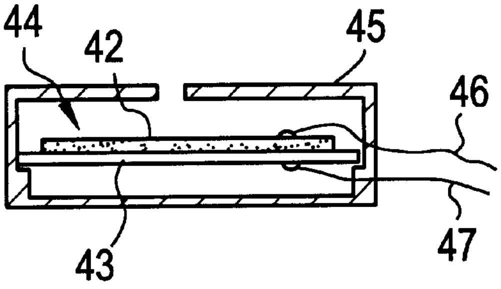
FIG. 1C PRIOR ART
Figure 2A:
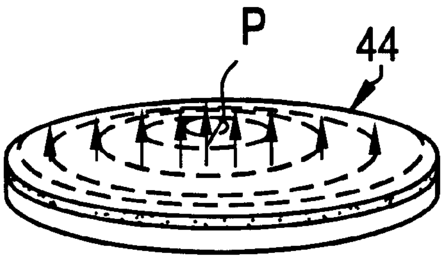
FIG. 2A PRIOR ART
FIG. 2A is a view showing distribution of displacements in a conventional circular vibration body.
Figure 2B:
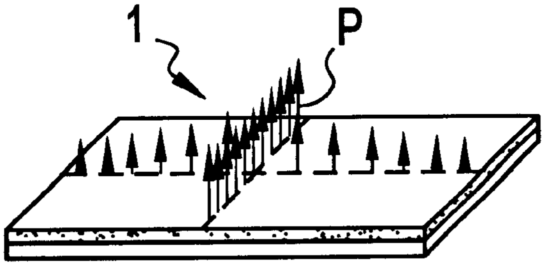
FIG. 2B PRIOR ART
FIG. 2B is a view showing distribution of displacements in a substantially rectangular vibration body according to one preferred embodiment of the present invention.
Figure 3:
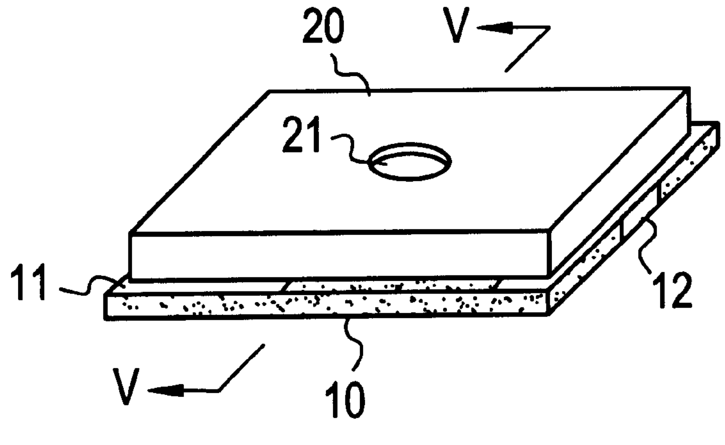
FIG. 3 is a perspective view showing a piezoelectric buzzer serving as an example of a piezoelectric acoustic component according to one preferred embodiment of the present invention.
Figure 4:
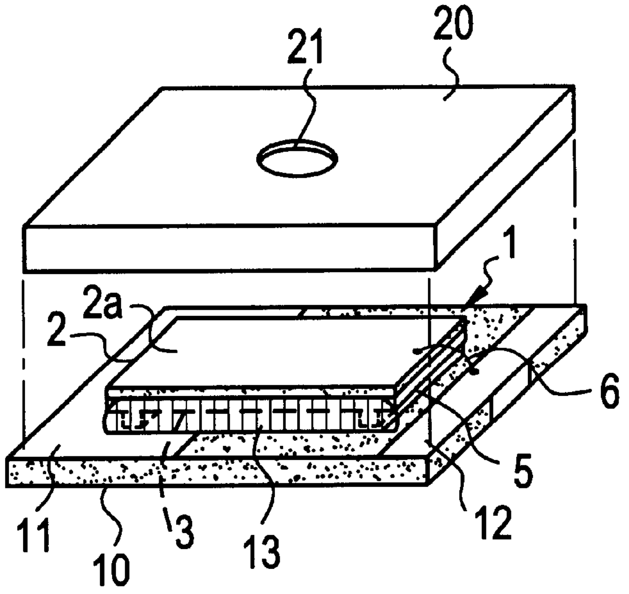
FIG. 4 is an exploded perspective view of the piezoelectric buzzer of FIG. 4.
Figure 5:
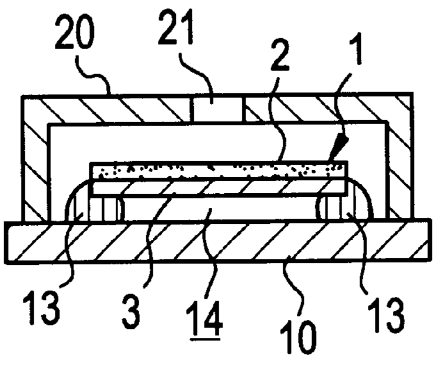
FIG. 5 is a sectional view taken along line V—V of FIG. 3.

FIGS. 3 to 5 show a piezoelectric buzzer according to one preferred embodiment of a piezoelectric acoustic component according to the present invention.

The piezoelectric buzzer preferably includes a unimorph-type vibration body 1, a mounting substrate 10, and a cover 20.

The vibration body 1 includes a substantially rectangular piezoelectric plate 2 made of piezoelectric ceramic, such as PZT, and a substantially rectangular metallic plate 3 bonded electrically and mechanically to the second major surface of the piezoelectric plate 2. The metallic plate 3 is preferably made of a material having good conductance and spring elasticity, such as phosphor bronze or 42Ni. When the metallic plate 3 is made of 42Ni, the metallic plate 3 has a thermal expansion coefficient close to that of ceramic (PZT, for example), so that a more reliable the vibration body 1 can be obtained. First and second vibration body electrodes 2*a* and 2*b* are disposed on the first and second major surfaces of the piezoelectric plate 2, respectively. The metallic plate 3 is bonded to the second vibration body electrode 2*b*, thereby establishing electrical conduction therebetween. In place of using the second vibration body electrode 2*b*, the metallic plate 3 may be directly bonded to the second major surface of the piezoelectric plate 2 by use of a conductive adhesive, i.e., the metallic plate 3 may also be used as the second vibration body electrode 2*b*.

Support members 4 and 5 made of a conductive material are fixed on the second major surface of the vibration body 1 at longitudinal opposite end portions thereof. The support members 4 and 5 may be defined, for example, by applying a conductive adhesive linearly to the lower surface of the metallic plate 3 and curing the applied linear adhesive or by attaching a linear conductive material, such as a metallic wire, fixedly to the lower surface of the metallic plate 3.

The vibration body 1 is electrically and mechanically bonded onto the insulating mounting substrate 10 via the support members 4 and 5. More specifically, the lower surface of the support member 4 is bonded onto a first circuit electrode 11 disposed on the mounting substrate 10 via a conductive adhesive (not shown), whereas the lower surface of the support member 5 is bonded onto a portion of the mounting substrate 10 at which no electrode is disposed, via a conductive adhesive or an insulating adhesive (not shown). The vibration body 1 is thus supported reliably and fixedly at the longitudinal opposite end portions while a predetermined gap is defined between the vibration body 1 and the mounting substrate 10. The vibration body 1, therefore, can vibrate vertically with the longitudinal opposite end portions of the body 1 functioning as nodes.

In the above description, the support members 4 and 5 are fixedly attached to the second major surface of the vibration body 1, and then the lower surfaces of the support members 4 and 5 are bonded onto the mounting substrate 10 via conductive adhesive. However, a step of forming the support members 4 and 5 and a step of bonding the vibration body 1 and the mounting substrate 10 together may be performed simultaneously. More specifically, the conductive adhesive may be applied linearly onto the upper surface of the mounting substrate 10 or the lower (second-major) surface of the vibration body 1 via printing or by use of a dispenser or other suitable method. Then, before the conductive adhesive is cured, the mounting substrate 10 and the vibration body 1 are bonded together while a predetermined gap is maintained therebetween. Subsequently, the conductive adhesive may be cured. This process involves fewer steps, thereby further improving production efficiency.

The first major surface of the vibration body 1, i.e., the first vibration body electrode 2*a*, is connected to a second circuit electrode 12 disposed on the mounting substrate 10 preferably via a conductive wire 6. The first circuit electrode 11 is disposed on the upper surface of the mounting substrate 10 at a portion bordering one of the opposite end surfaces and extends along the end surface and to the back side. The second circuit electrode 12 is disposed on the upper surface of the mounting substrate 10 at a portion bordering the other end surface and extends along the end surface and to the back side.

A gap between the mounting substrate 10 and each of lateral opposite end portions of the vibration body 1 is charged with an elastic sealing material 13, such as silicone rubber, thereby defining an acoustic space 14 (see FIG. 5) between the vibration body 1 and the mounting substrate 10. The acoustic space 14 is not necessarily sealed completely. For example, an appropriate damping hole may be formed in the mounting substrate 10 for communication with the exterior of the component. The sealing material 13 does not hinder vibration of the vibration body 1 because of the elasticity thereof.

A resin cover 20 is bonded onto the mounting substrate 10 so as to cover the vibration body 1 in a non-contacting manner. That is, the cover 20 does not contact the vibration body 1 at any portion thereof. The cover 20 has sound release hole 21 provided in the top thereof for releasing a sound such as a buzzer beep to the exterior of the component through the hole 21.

Figure 6:
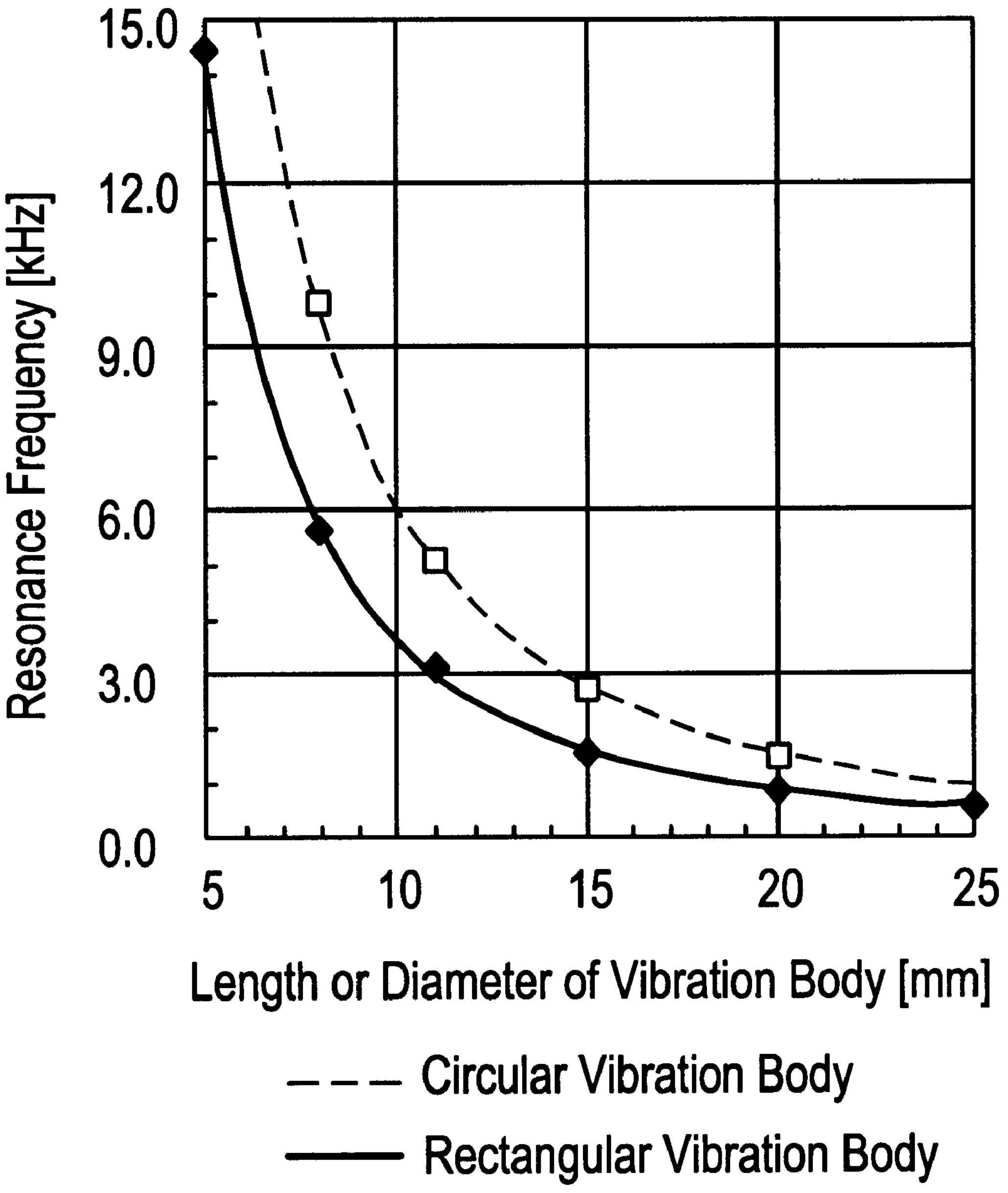
FIG. 6 is a graph comparing a circular vibration body and a substantially rectangular vibration body in terms of the relationship between size and resonance frequency.

FIG. 6 compares a circular vibration body used in the prior art and a substantially rectangular vibration body used in preferred embodiments of the present invention, in terms of the relationship between size and resonance frequency.

As seen from FIG. 6, the size (length) of the substantially rectangular vibration body can be made smaller than that (diameter) of the circular vibration body for the same resonance frequency. In other words, when the substantially rectangular body and the circular vibration body have the same size, the substantially rectangular vibration body produces a lower resonance frequency than does the circular vibration body.

The comparison of FIG. 6 was performed by use of a piezoelectric plate of PZT having a thickness of about 50 $\mu$m and a metallic plate made of 42Ni having a thickness of about 50 $\mu$m. The substantially rectangular vibration body had a ratio of about 1.67 between length L and width W.

Figure 7A:
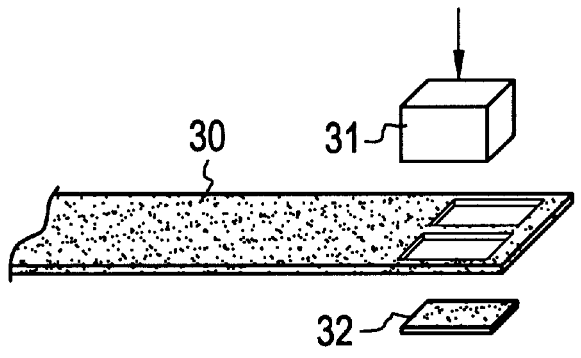
FIGS. 7A–7C are views showing the steps of a process for making a substantially rectangular vibration body.
Figure 7B:
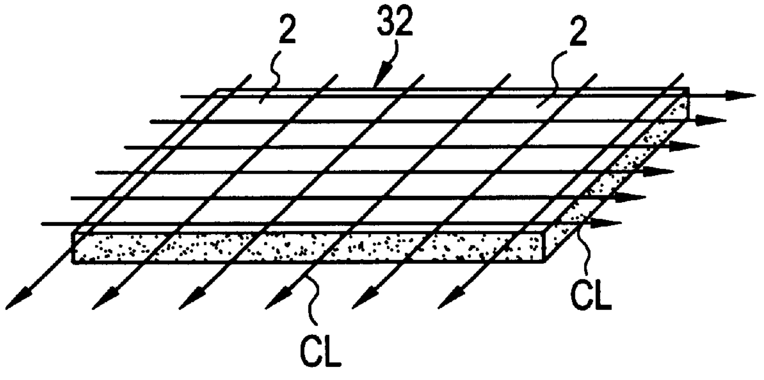
Figure 7C:
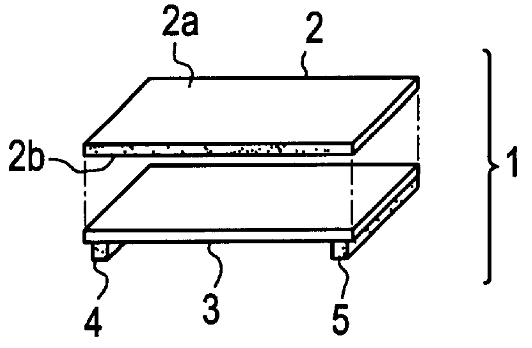

FIGS. 7A to 7C show a process of manufacturing the vibration body 1.

First, as shown in FIG. 7A, a substantially rectangular parent substrate 32 is blanked from a green sheet 30 by use of a blanking punch 31.

Next, as shown in FIG. 7B, the parent substrate 32 undergoes formation of electrodes and polarization and is then cut along longitudinal and lateral cut lines CL, thereby yielding the piezoelectric plates 2.

Then, as shown in FIG. 7C, by use of a conductive adhesive, the piezoelectric plate 2 is bonded to the metallic plate 9 which preferably has a shape that is similar to that of the piezoelectric plate 2. The support members 4 and 5 are disposed on the lower surface of the metallic plate 3 at opposite end portions, thereby yielding the vibration body 1.

Since the parent substrate 32 to be blanked from the green sheet 30 has a substantially rectangular shape, the amount of unused portion of the green sheet 30 is greatly decreased, thereby achieving a high material utilization rate. Since formation of electrodes and polarization is performed on the parent substrate 32, from which a plurality of piezoelectric plates 2 are cut, i.e., since these process steps are performed simultaneously for the plurality of piezoelectric plates 2, production efficiency is greatly improved and is very high. Since various kinds of piezoelectric plates having different design dimensions can be produced by changing the cutting dimensions or positions of the parent substrate, the size of the blanking punch 32 can be unchanged, thereby reducing the cost of equipment because a universal punch can be used. Specifically, the number of kinds of, for example, dies, jigs, and piezoelectric bodies used in production steps ranging from blanking of the green sheet 30 to cutting of the parent substrate 32 are greatly reduced.

According to the production steps depicted in FIGS. 7B and 7C, after the parent substrate 32 is cut into the piezoelectric plates 2, each piezoelectric plate 2 is bonded to the metallic plate 3. However, the parent substrate 32 which has undergone formation of electrodes and polarization may be bonded to a metallic parent substrate. Then, the resultant bonded body may be cut into vibration bodies, each of which includes one piezoelectric plate 2 and one metallic plate 3.

Next, a process of making a piezoelectric buzzer will be described with reference to FIGS. 8A to 8D.

Figure 8A:
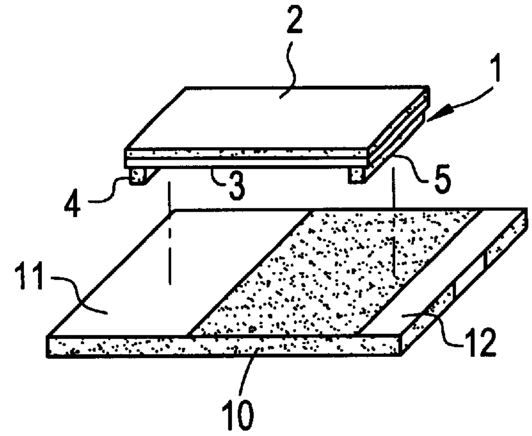
FIGS. 8A–8D are views showing the steps of a process for making a substantially rectangular piezoelectric buzzer.

First, as shown in FIG. 8A, the vibration body 1 is bonded to the mounting substrate 10 on which the first and second circuit-electrodes 11 and 12, respectively, have been previously formed, with the support members 4 and 5 interposed therebetween. In this case, the support member 4 is bonded to the first circuit-electrode 11, and the support member 5 is bonded to a portion of the mounting substrate 10 where no electrode is located.

Figure 8B:
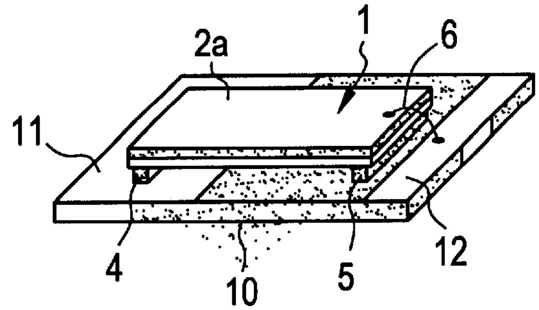

Next, as shown in FIG. 8B, the vibration body electrode 2*a* of the piezoelectric plate 2 and the second circuit electrode 12 are connected preferably via a conductive wire 6. This connection may be performed by, for example, a wire bonding method or other suitable method. Preferably, the conductive wire 6 is connected to the vibration body electrode 2*a* at a position located above the support member 5, which functions as a node of vibration of the vibration body 1.

Figure 8C:
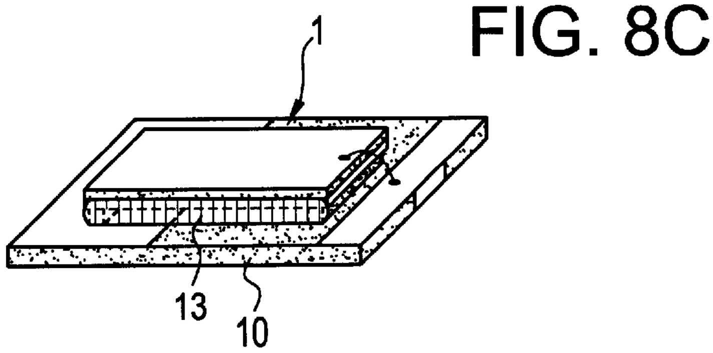

Then, as shown in FIG. 8C, silicone rubber 13 is charged into a gap defined between the mounting substrate 10 and each of lateral opposite end portions of the vibration body 1, thereby defining an acoustic space 14 between the vibration body 1 and the mounting substrate 10. The range of application of the silicone rubber 13 is not limited to the lateral opposite end portions of the vibration body 1. Alternatively, the silicone rubber 13 may be applied to the entire periphery of the vibration body.

Figure 8D:
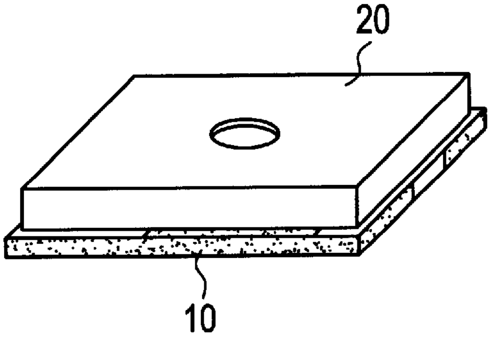

Finally, as shown in FIG. 8D, the cover 20 is bonded to the mounting substrate 10 so as to cover the vibration body 1. Thus, a surface mounting piezoelectric acoustic component is produced.

According to the above-described manufacturing process, the vibration body 1 and the cover 20 are bonded to each mounting substrate 10. However, a parent mounting substrate may be used in place of the mounting substrate 10. In this case, a manufacturing process includes the steps of: bonding a plurality of vibration bodies 1 onto the parent mounting substrate at substantially constant intervals; bonding a plurality of covers 20 onto the parent mounting substrate so as to cover the corresponding vibration bodies 1; and cutting the parent mounting-substrate, thereby producing individual piezoelectric acoustic components.

The above preferred embodiments are described in terms of the mounting substrate 10 supporting a single vibration body 1. However, the present invention is not limited thereto. The mounting substrate 10 may support a plurality of vibration bodies 1. In this case, individual electrodes corresponding to the vibration bodies 1 may be provided on the mounting substrate 10. Through connection of the electrodes to the corresponding vibration bodies 1, the vibration bodies 1 can produce individually different sounds.

The above preferred embodiments are described to include mention of the support members of a conductive material. However, the present invention is not limited thereto. The support members may be made of an insulating material (adhesive, for example). In this case, the metallic plate and the first electrode disposed on the mounting substrate may be connected via, for example, solder, conductive adhesive, or conductive wire.

The piezoelectric plate and the metallic plate do not necessarily have to have the same size. For example, the size of the metallic plate may be slightly larger than that of the piezoelectric plate. For example, when the metallic plate is longer than the piezoelectic plate, a resonance frequency produced depends on the difference in length.

The above preferred embodiments are described in terms of a conductive wire for connecting the second vibration body electrode disposed on the second major surface of the piezoelectric plate to the second circuit electrode disposed on the mounting substrate. However, the present invention is not limited thereto. A lead terminal may be used in place of the conductive wire. In this case, one end portion of the lead terminal may be in elastic contact with the second vibration body electrode disposed on the second major surface of the piezoelectric plate or may be fixedly connected by use of solder or conductive paste.

The above preferred embodiments are described in connection with a unimorph-type vibration body. The present invention is not limited thereto. A bimorph-type vibration body, which includes a piezoelectric plate and two metallic plates attached onto the opposite sides of the piezoelectric plate, may also be used.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric acoustic component comprising:

a vibration body including a substantially rectangular piezoelectric plate having a first major surface and a second major surface, a first vibration body electrode provided on the first major surface of the piezgelectric plate and a substantially rectangular metallic plate provided on the second major surface of the piezoelectric plate;

a mounting substrate including a first circuit electrode and a second circuit electrode disposed thereon, the first circuit electrode being connected to the metallic plate, the second circuit electrode being connected to the first vibration body electrode;

support members being arranged such that the vibration body is mounted on the mounting substrate at longitudinal opposite end portions thereof via the support members such that a gap is defined between the mounting substrate and the longitudinal opposite end portions of the vibration body;

an elastic sealing material sealing the gap between the mounting substrate and each of lateral opposite end portions of the vibration body to thereby define an acoustic space between the vibration body and the mounting substrate; and a cover having a sound release hole provided therein and which is bonded onto the mounting substrate so as to cover the vibration body without the cover contacting the vibration body.

2. The piezoelectric acoustic component according to claim 1, wherein the support members are made of a conductive material.

3. The piezoelectric acoustic component according to claim 2, wherein the metallic plate of the vibration body is fixedly connected to the first circuit electrode disposed on the mounting substrate via at least one of the support members.

4. The piezoelectric acoustic component according to claim 1, wherein the support members are made of an insulating material.

5. The piezoelectric acoustic component according to claim 1, further comprising a conductive wire, wherein the first vibration body electrode disposed on the first major surface of the piezoelectric plate is connected to the second circuit electrode disposed on the mounting substrate via the conductive wire.

6. The piezoelectric acoustic component according to claim 1, wherein the piezoelectric plate and the metallic plate have substantially the same size.

7. The piezoelectric acoustic component according to claim 1, wherein the piezoelectric plate and the metallic plate have different sizes.

8. The piezoelectric acoustic component according to claim 1, wherein the vibration body is a unimorph-type vibration body.

9. The piezoelectric acoustic component according to claim 1, wherein the elastic sealing material is silicone rubber.

10. The piezoelectric acoustic component according to claim 1, the elastic sealing material is applied to an entire peripheral surface of the vibration body.

11. A piezoelectric acoustic component comprising:

a vibration body including a substantially rectangular piezoelectric plate having a first major surface and a second major surface, a first vibration body electrode provided on the first major surface of the piezoelectric plate and a substantially rectangular metallic plate provided on the second major surface of the piezoelectric plate;

a mounting substrate including a first circuit electrode and a second circuit electrode disposed thereon, the first circuit electrode being connected to the metallic plate, the second circuit electrode being connected to the first vibration body electrode;

support members being arranged such that the vibration body is mounted on the mounting substrate via the support members such that a gap is defined between the mounting substrate and the vibration body; and an elastic sealing material sealing the gap between the mounting substrate and each of lateral opposite end portions of the vibration body to thereby define an acoustic space between the vibration body and the mounting substrate.

12. The piezoelectric component according to claim 11, further comprising a cover having a sound release hole provided therein and which is bonded onto the mounting substrate so as to cover the vibration body without the cover contacting the vibration body.

13. The piezoelectric acoustic component according to claim 11, wherein the support members are made of a conductive material.

14. The piezoelectric acoustic component according to claim 13, wherein the metallic plate of the vibration body is fixedly connected to the first circuit electrode disposed on the mounting substrate via at least one of the support members.

15. The piezoelectric acoustic component according to claim 11, further comprising a conductive wire, wherein the first vibration body electrode disposed on the first major surface of the piezoelectric plate is connected to the second circuit electrode disposed on the mounting substrate via the conductive wire.

16. The piezoelectric acoustic component according to claim 11, wherein the piezoelectric plate and the metallic plate have substantially the same size.

17. The piezoelectric acoustic component according to claim 11, wherein the piezoelectric plate and the metallic plate have different sizes.

18. The piezoelectric acoustic component according to claim 11, wherein the vibration body is a unimorph-type vibration body.

19. The piezoelectric acoustic component according to claim 11, the elastic sealing material is applied to an entire peripheral surface of the vibration body.

* * * * *